(12) United States Patent
Chen et al.

(10) Patent No.: US 11,075,226 B2
(45) Date of Patent: *Jul. 27, 2021

(54) DISPLAY DEVICE

(71) Applicant: InnoLux Corporation, Miao-Li County (TW)

(72) Inventors: Yun-Sheng Chen, Miao-Li County (TW); Hsia-Ching Chu, Miao-Li County (TW); Ming-Chien Sun, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 24 days.

This patent is subject to a terminal disclaimer.

(21) Appl. No.: 16/378,806

(22) Filed: Apr. 9, 2019

(65) Prior Publication Data
US 2019/0237491 A1    Aug. 1, 2019

Related U.S. Application Data

(63) Continuation of application No. 15/725,356, filed on Oct. 5, 2017, now Pat. No. 10,297,620.

(30) Foreign Application Priority Data

Oct. 12, 2016   (CN) ......................... 201610889344.1

(51) Int. Cl.
*H01L 27/12*   (2006.01)
*H01L 23/522*   (2006.01)
(Continued)

(52) U.S. Cl.
CPC ...... *H01L 27/1244* (2013.01); *H01L 23/5226* (2013.01); *H01L 23/5283* (2013.01); *H01L 27/1225* (2013.01); *H01L 27/1255* (2013.01); *H01L 27/3276* (2013.01); *H01L 29/42384* (2013.01); *H01L 27/156* (2013.01); *H01L 27/3262* (2013.01); *H01L 27/3265* (2013.01)

(58) Field of Classification Search
CPC ............ H01L 27/1244; H01L 27/1225; H01L 27/1255; H01L 27/3276; H01L 27/156; H01L 27/3262; H01L 27/6265; H01L 23/5226; H01L 23/5283; H01L 29/42384
See application file for complete search history.

(56) References Cited

U.S. PATENT DOCUMENTS 6,327,006 B1   12/2001   Sato et al.
6,583,472 B1   6/2003   Shibata et al.
(Continued)

FOREIGN PATENT DOCUMENTS

CN          101626011 A       1/2010

*Primary Examiner* — Mark W Tornow
(74) *Attorney, Agent, or Firm* — Bacon & Thomas, PLLC

(57) ABSTRACT

The disclosed display device includes: a substrate; a gate electrode disposed on the substrate, wherein a first projection is defined by projecting the gate electrode on the substrate; and a connecting member disposed on the gate electrode and electrically connecting to the gate electrode, wherein a second projection is defined by projecting the connecting member on the substrate, an overlapping region is defined as a region of the second projection overlapping the first projection, and an area of the first projection is greater than an area of the overlapping region.

20 Claims, 7 Drawing Sheets

(51) Int. Cl.
*H01L 23/528* (2006.01)
*H01L 27/32* (2006.01)
*H01L 29/423* (2006.01)
*H01L 27/15* (2006.01)

(56) References Cited

U.S. PATENT DOCUMENTS

| | | |
|---|---|---|
| 10,297,620 B2 * | 5/2019 | Chen .................. H01L 27/3276 |
| 2010/0045885 A1 | 2/2010 | Imai et al. |
| 2015/0187860 A1 * | 7/2015 | Seo .................... H01L 29/78648 257/40 |
| 2016/0260790 A1 * | 9/2016 | Lee .................... H01L 27/3265 |
| 2018/0102381 A1 | 4/2018 | Chen et al. |

* cited by examiner

DISPLAY DEVICE

CROSS REFERENCE TO RELATED APPLICATION

This application claims the benefits of the Chinese Patent Application Serial Number 201610889344.1, filed on Oct. 12, 2016, the subject matter of which is incorporated herein by reference.

This application is a continuation (CA) of U.S. Patent application for "Display device", U.S. application Ser. No. 15/725,356 filed Oct. 5, 2017, and the subject matter of which is incorporated herein by reference.

BACKGROUND

1. Field

The present disclosure is relates to a display device and, more particularly, to a display device having a connecting member connecting a driving transistor and a compensation transistor.

2. Description of Related Art

With the continuous advancement of technologies related to displays, all the display devices are now developed toward compactness, thinness, and lightness. This trend makes thin displays, such as liquid crystal display devices, organic light-emitting diode display devices and inorganic light-emitting diode display devices, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

The organic light-emitting diode (OLED) display devices has advantages of: light weight, thin thickness, high brightness, fast response, large viewing angle, no need for backlight, low manufacturing cost and flexibility, and is considered as a next-generation display device.

SUMMARY

The display device of the present disclosure comprises: a substrate; a gate electrode disposed on the substrate, wherein a first projection is defined by projecting the gate electrode on the substrate, and the first projection includes a first outline; a first insulating layer disposed on the gate electrode; a metal layer disposed on the first insulating layer, the metal layer including an opening, wherein a second projection is defined by projecting the opening on the substrate, and the second projection includes a second outline; a second insulating layer disposed on the metal layer; a connecting member disposed on the second insulating layer, the connecting member electrically connecting to the gate electrode through a contact via penetrating the first insulating layer and the second insulating layer, wherein a third projection is defined by projecting the connecting member on the substrate, and the third projection includes a third outline; and a display unit disposed on the second insulting layer. Herein, the first outline crosses the third outline at a first intersection and a second intersection, the second outline crosses the third outline at a third intersection and a fourth intersection, a first distance between the first intersection and the second intersection is less than a second distance between the third intersection and the fourth intersection.

In the display device of the present disclosure, a first projection defined by projecting the gate electrode on the substrate include a first outline, a second projection defined by projection the metal layer on the substrate includes a second outline, and a third projection defined by projecting the connecting member on the substrate includes a third outline. Herein, the width of the connecting member on the second outline (i.e. the second distance between the third intersection and the fourth intersection) is greater than the width of the connecting member on the first outline (i.e. the first distance between the first intersection and the second intersection), which indicates that the connecting member has a larger width at the opening of the metal layer in comparison with another part of the connecting member that locates outside the opening of the metal layer and simultaneously overlaps the gate electrode and the metal layer.

Furthermore, in the display device of the present disclosure, the display device further comprise a compensation transistor, the connecting member comprises a first terminal part and a second terminal part, the first terminal part electrically connects to the gate electrode through the contact via, and the second terminal part electrically connects to the compensation transistor.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" to "sixth" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Furthermore, the features in the different embodiments of the present disclosure can be combined or mixed to form another embodiment.

Figure 1A:
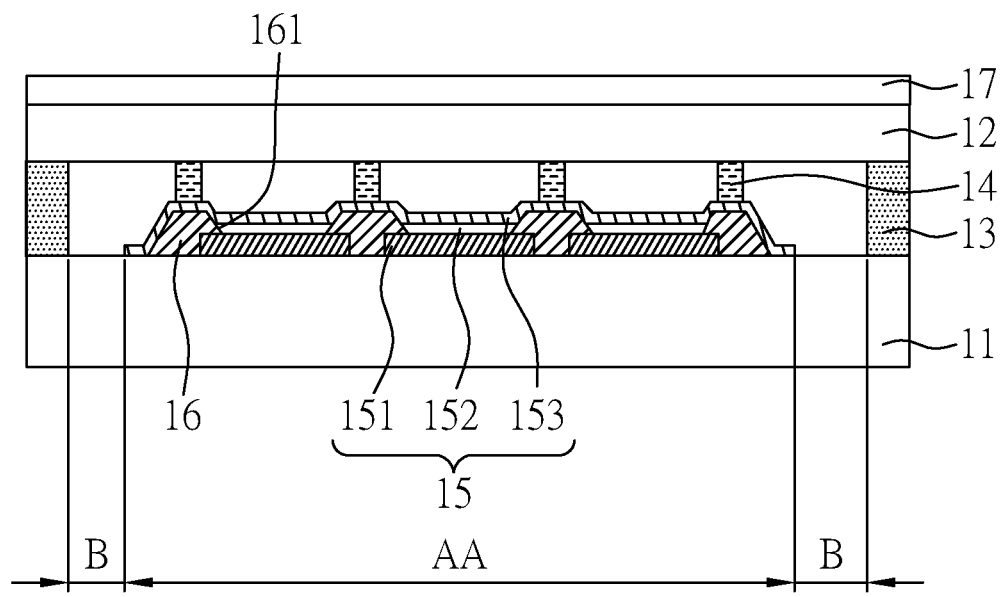
FIG. 1A is a cross sectional view of a display device according to one embodiment of the present disclosure.

FIG. 1A is a cross sectional view of a display device according to one embodiment of the present disclosure. In the process for manufacturing the display device, a substrate 11 and a counter substrate 12 are provided, which can be a glass substrate, or other rigid substrate. Herein, a display unit 15 and pixel defining layers 16 are disposed on the substrate 11, and each of the pixel defining layers 16 is disposed between two adjacent display units 15. Meanwhile, plural spacers 14 are disposed on the counter substrate 12. A sealant 13 (for example, a frit sealant, but the present disclosure is not limited thereto) is formed on edges of the counter substrate 12, and is adhered on the counter substrate 12 via a dispensing and an annealing process. Next, the substrate 11 and the counter substrate 12 are assembled, and the spacers 14 on the counter substrate 12 correspond to the regions of the pixel defining layers 16 without the pixel openings 161 formed therein. After an annealing process, the sealant 13 is adhered on the substrate 11 to obtain the display device of the present embodiment. In addition, a polarizer 17 is disposed on the counter substrate 12.

Figure 1B:
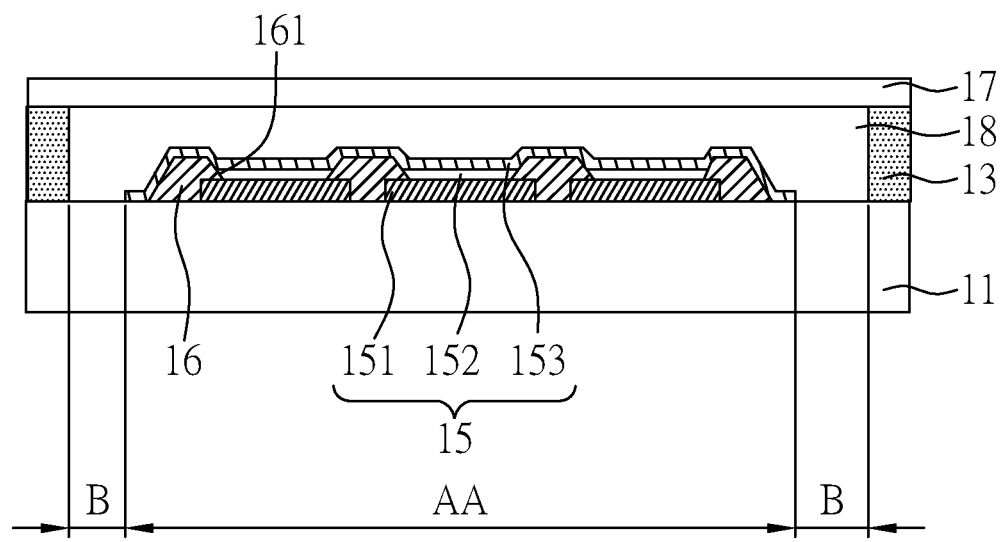
FIG. 1B is a cross sectional view of a display device according to another embodiment of the present disclosure.

FIG. 1B is a cross sectional view of a display device according to another embodiment of the present disclosure. The difference between the display devices of FIG. 1A and FIG. 1B is that the display device of FIG. 1B is not equipped with the counter substrate. The display device further comprises an encapsulation layer 18 disposed on the display unit 15, and a polarizer 17 is disposed on the encapsulation layer 18. Herein, the encapsulation layer 18 comprises an inorganic/organic/inorganic composite layer. In the display device of FIG. 1B, the substrate 11 is a flexible substrate, which can be a plastic substrate, a film or other flexible substrate. The flexible substrate can be made of polyimide, polycarbonate, polyethylene terephthalate, etc. However, the substrate can be a rigid substrate as well. The rigid substrate can be made of glass, sapphire, ceramic, quartz, etc. When the substrate 11 is a flexible substrate, the sealant 13 is an adhesion and the aforementioned annealing process is not performed. In addition, since the substrate 11 is the flexible substrate, the display device of FIG. 1B is a flexible display device.

As shown in FIG. 1A or FIG. 1B, the display device of the present embodiment comprises a display region AA and a border region B, wherein the border region B is adjacent to the display region AA and is located outside the display region AA. The border region B is the region with circuits formed thereon, and the display region AA is the region with the aforesaid display units 15 and transistors (not shown in the figure) formed thereon. Furthermore, in the present embodiment, each of the display units 15 can respectively emit red, green or blue light, but other embodiments of the present disclosure are not limited thereto. For example, the display units can be a white OLED units; in this case, a color filter unit (not shown in the figure) is further disposed on one of the substrate 11 and the counter substrate 12. And the color filter unit can be doped with quantum dot particles.

In addition, as shown in FIG. 1A or FIG. 1B, in the display device of the present embodiment, the display unit 15 comprises: a first electrode 151, a second electrode 153, and a light emitting layer 152 disposed between the first electrode 151 and the second electrode 153. In the present embodiment, the light emitting layer 152 is an organic light emitting layer. However, the present disclosure is not limited to. In other embodiment of the present disclosure, the light emitting layer 152 can be an inorganic light emitting layer, and the formed display device is an inorganic light emitting diode display device, such as micro-LED display device or QD display device.

In the present embodiment, the first electrode 151 electrically connects to the transistor (not shown in the figure) formed on the substrate 11, the pixel defining layer 16 is disposed between the first electrode 151 and the light emitting layer 152, and a light emitting region is defined by the pixel opening 161 of the pixel defining layer 16. Herein, only the display unit comprising the first electrode 151, the light emitting layer 152 and the second electrode 153 is exemplified, but the present disclosure is not limited thereto. Other elements capable of using in the OLED unit can also be applied to the display unit of the present embodiment. For example, other elements including an electron transporting layer, an electron injection layer, a hole transporting layer, a hole injection layer and other layers capable of facilitating the combination of electrons and holes can also be used in the display units of the present disclosure.

Figure 2:
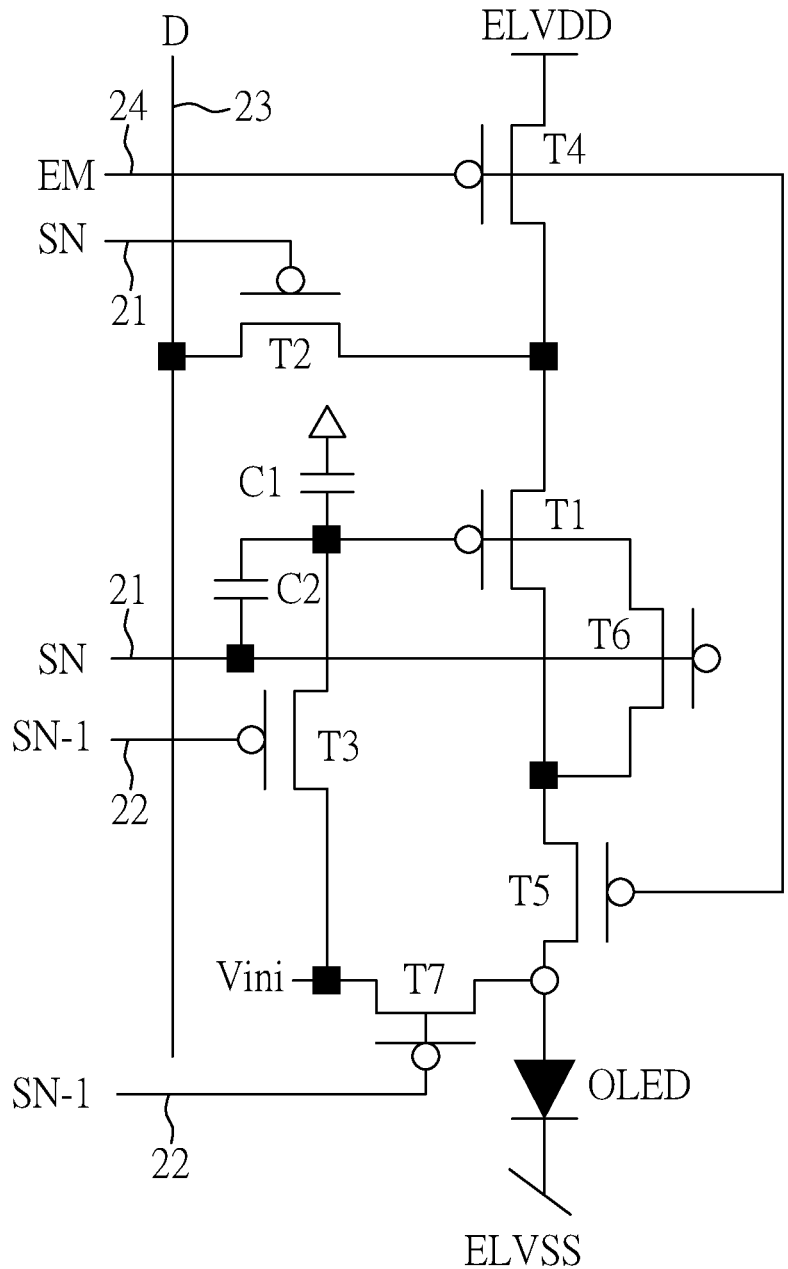
FIG. 2 shows an equivalent circuit in a pixel region of a display device according to one embodiment of the present disclosure.

FIG. 2 shows an equivalent circuit in a pixel region of a display device according to one embodiment of the present disclosure. One pixel region comprises seven transistors, which respectively are a driving transistor T1, a switch transistor T2, a compensation transistor T3, an initialization transistor T4, an operation control transistor T5, an emission control transistor T6, and a bypass transistor T7. In addition, the pixel region further comprises two capacitors, which respectively are a compensation capacitor C1 and a storage capacitor C2. Furthermore, the pixel region further comprises: scan lines 21, 22 providing scan signal SN, SN−1, data line 23 providing data signal D, signal lines 24 providing emission control signal EM, and a OLED unit. Therein, a driving voltage ELVDD and a common voltage ELVSS are provided to the OLED unit, and an initialization voltage Vini is provided to the compensation transistor T3 and the bypass transistor T7.

Figure 3:
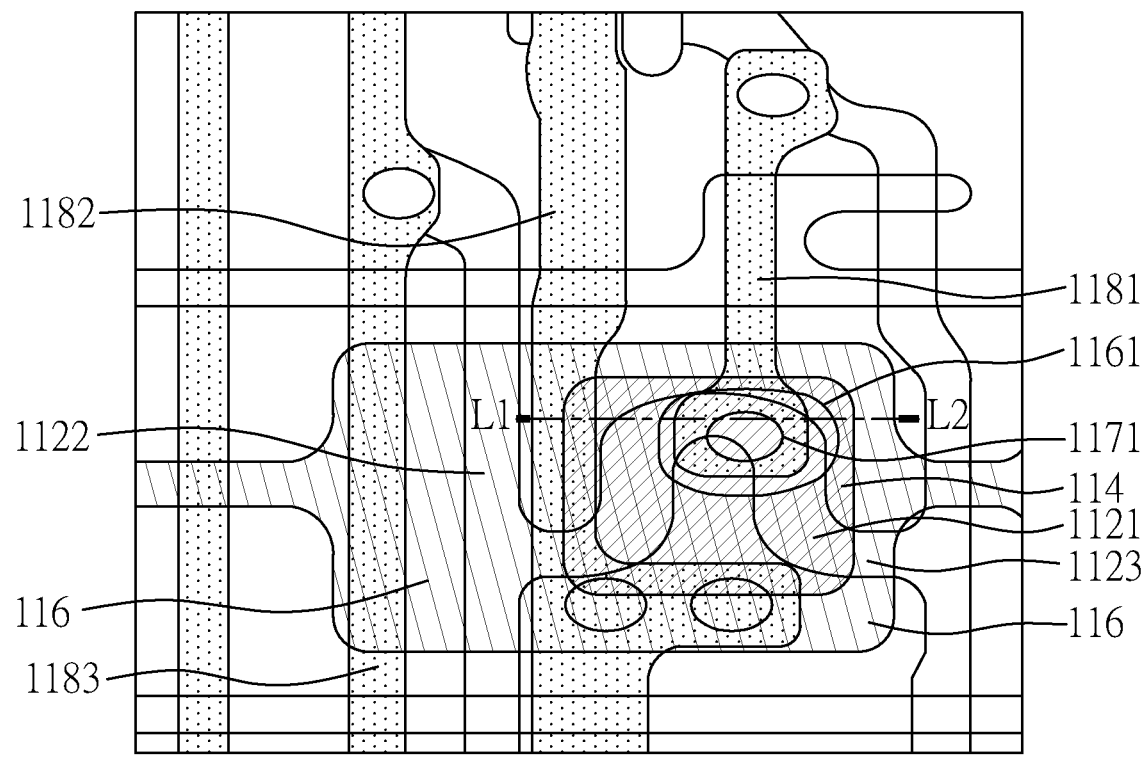
FIG. 3 is a top view showing a part of a display device according to one embodiment of the present disclosure.
Figure 4:
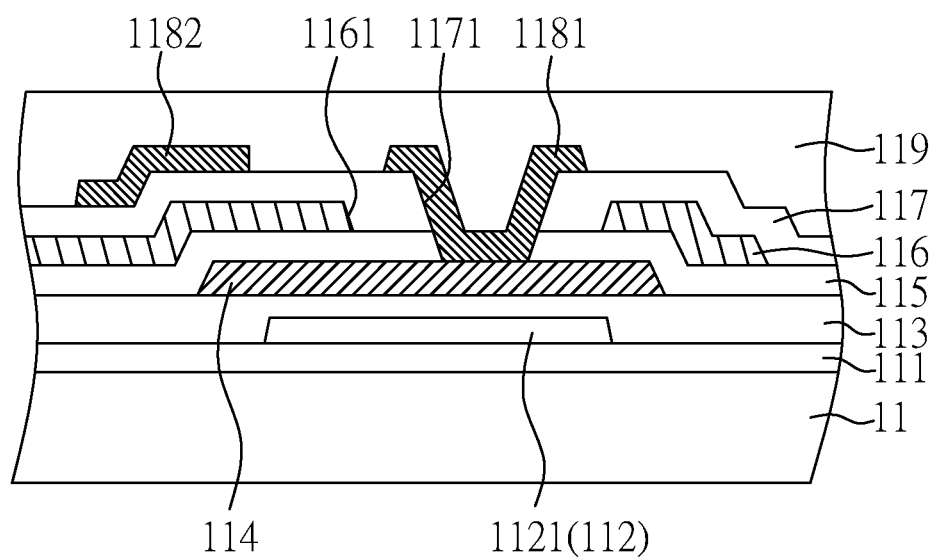
FIG. 4 is a cross sectional view of FIG. 3 along the line L1-L2.
Figure 5:
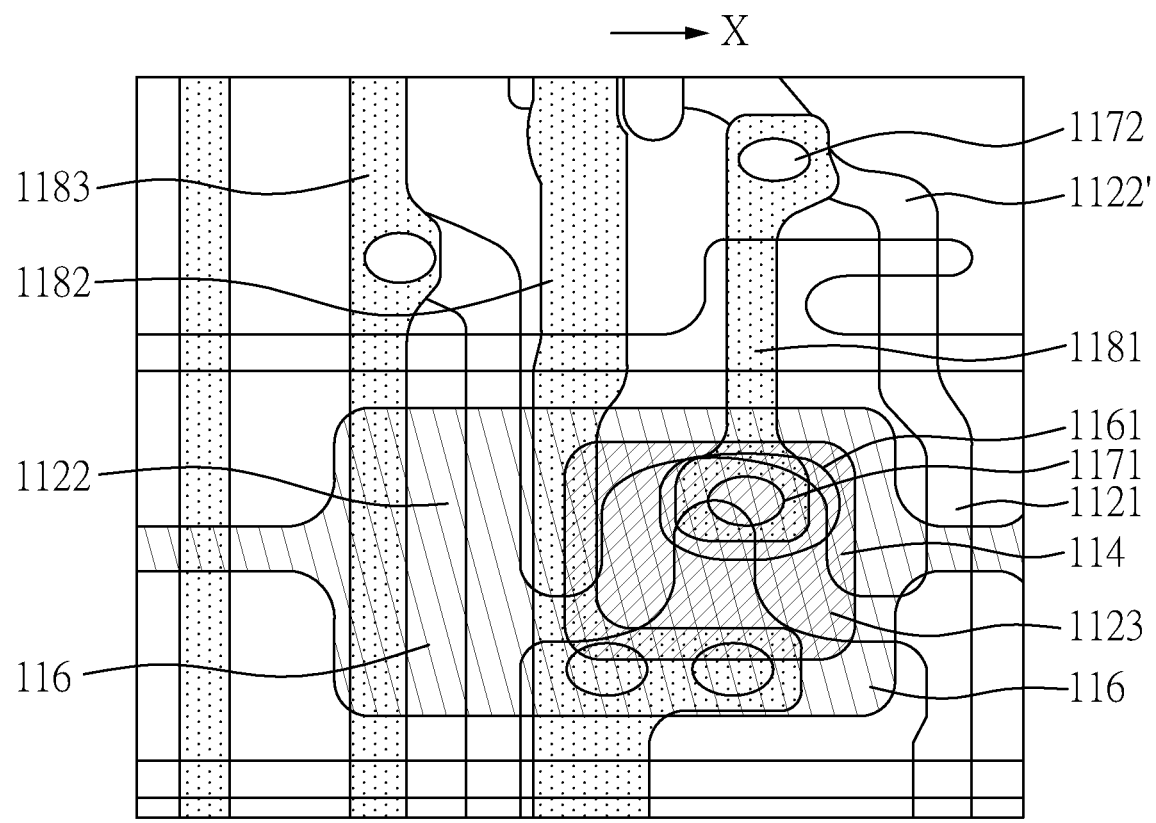
FIG. 5 is a top view showing a part of a display device according to one embodiment of the present disclosure.

FIG. 3 and FIG. 5 are top views showing a part of a display device according to one embodiment of the present disclosure, which show outlines included in projections defined by projecting the elements on the substrate. FIG. 4 is a cross sectional view of FIG. 3 along the line L1-L2. Herein, FIG. 3 and FIG. 5 are the same view, and the difference therebetween is the signs.

The process for manufacturing the display device of the present embodiment is illustrated in brief. As shown in FIG. 3 to FIG. 5, a substrate 11 is provided, followed by forming a buffer layer 111 on the substrate 11. Next, a transistor is formed on the buffer layer 111. Herein, the driving transistor shown in FIG. 3 to FIG. 5 is exemplified. A semiconductor layer 112 is formed on the buffer layer 111, and the semiconductor layer 112 is doped to form a channel region 1121, a drain electrode 1122, and a source electrode 1123; wherein the drain electrode 1122 and the source electrode 1123 are the doped region, and the channel region 1121 is the non-doped region and locating between the drain electrode 1122 and the source electrode 1123. In the present disclosure, the relation between the drain electrode 1122 and the source electrode 1123 are not limited. When one is a source electrode, the other is a drain electrode; and vice versa. Next, a gate insulting layer 113 is formed on the semiconductor layer 112, and a gate electrode 114 is formed on the gate insulating layer 113. After the aforementioned process, the manufacture of the driving transistor in the display device of the present embodiment is completed.

A first insulating layer 115 is formed on the gate electrode 114, followed by forming a metal layer 116 on the first insulating layer 115. Herein, the overlapping region between the metal layer 116 and the gate electrode 114 can form a capacitor, which is the compensation capacitor C1 shown in FIG. 2. Then, a second insulating layer 117 is formed on the metal layer 116, followed by forming a connecting member 1181, a power supply circuit 1182 and a data line 1183 on the second insulating layer 117. Finally, a planer layer 119 is formed.

In the present embodiment, the material of the semiconductor layer 112 can comprise a-silicon, polysilicon or oxide semiconductor material (for example, IGZO, IZO, ITZO or other metal oxide), wherein the semiconductor layer 112 can be p-doped or n-doped to form the drain electrode 1122 and the source electrode 1123. In the present embodiment, the material of the semiconductor layer 112 comprises polysilicon. In addition, the material of the gate insulting layer 113, the first insulating layer 115, the second insulating layer 117 and the planer layer 119 may comprise an insulating material, such as silicon oxide, silicon nitride or silicon oxynitride. Furthermore, the material of the gate electrode 114, the metal layer 116, the connecting member 1181, the power supply circuit 1182 and the data line 1183 can comprise metal, alloy, metal oxide, metal oxynitride, or other electrode material. The aforementioned materials are listed only for example, but the present disclosure is not limited thereto.

As shown in FIG. 3 to FIG. 5, after the aforementioned process, the display device of the present embodiment is completed, which comprises: a substrate 11; a driving transistor disposed on the substrate 11, wherein the driving transistor comprises a gate electrode 114, a source electrode 1123 and a drain electrode 1122; a first insulating layer 115 disposed on the gate electrode 114; a metal layer 116 disposed on the first insulating layer 115, wherein the metal layer 116 includes an opening 1161; a second insulating layer 117 disposed on the metal layer 116; a connecting member 1181 disposed on the second insulating layer 117 and electrically connecting to the gate electrode 114 through a contact via 1171 penetrating the first insulating layer 115 and the second insulating layer 117; and a display unit (which is the display unit 15 shown in FIG. 1A or FIG. 1B) disposed on the second insulting layer 117.

When the elements on the substrate 11 are projected onto the substrate 11 to obtain projections, outlines included in the obtained projections are shown in FIG. 3 and FIG. 5. Herein, a first projection is defined by projecting the gate electrode 114 on the substrate 11, and the first projection includes a first outline; a second projection is defined by projecting the opening 1161 of the metal layer 116 on the substrate 11, and the second projection includes a second outline; and a third projection is defined by projecting the connecting member 1181 on the substrate 11, and the third projection includes a third outline.

Figure 6:
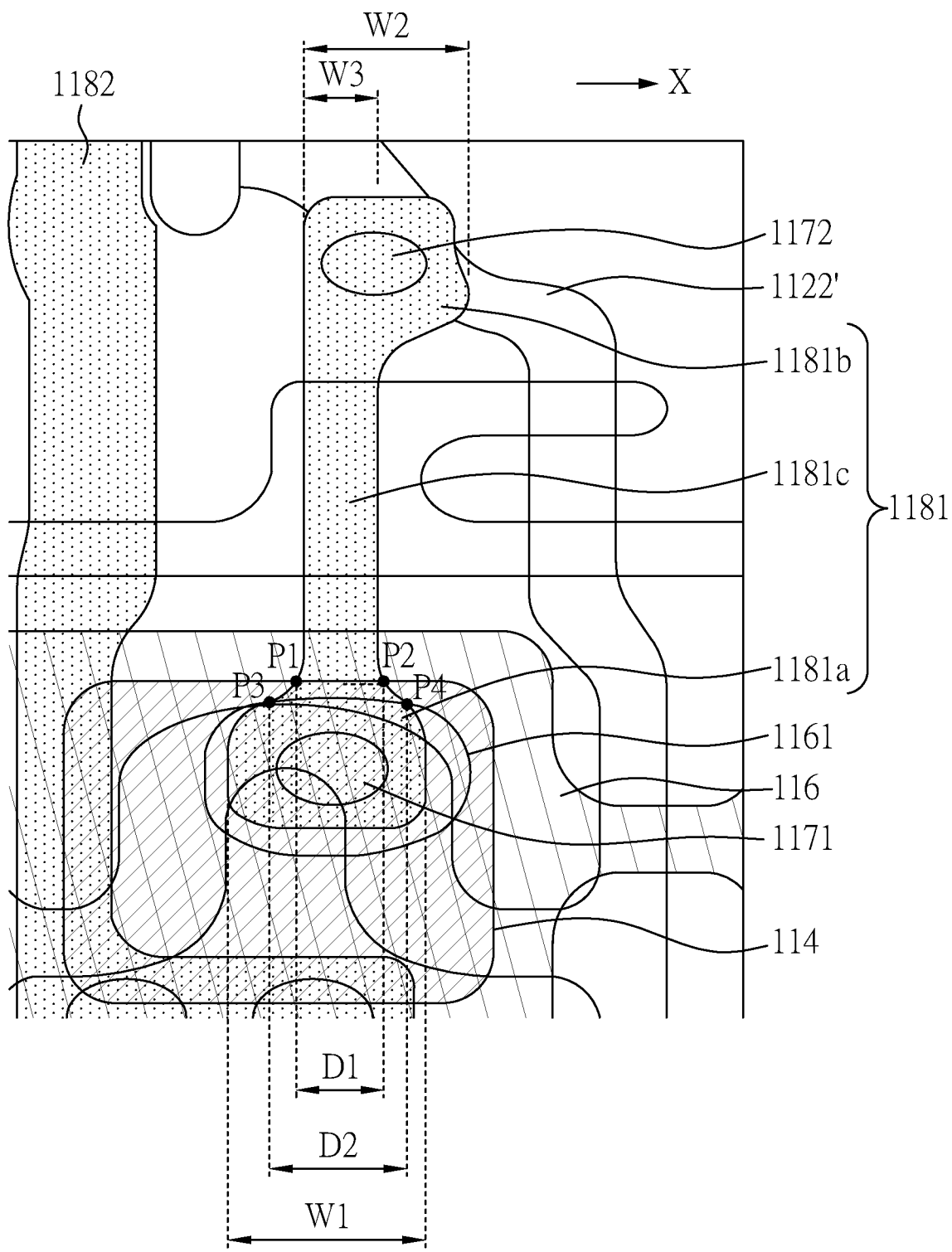
FIG. 6 and FIG. 7 are enlarged views of parts of FIG. 5.

FIG. 6 is an enlarged view of parts of FIG. 5. As shown in FIG. 6, the third outline included in the third projection of the connecting member 1181 crosses the first outline included in the first projection of the gate electrode 114 at a first intersection P1 and a second intersection P2, and a first distance D1 is between the first intersection P1 and the second intersection P2. In addition, the third outline included in the third projection of the connecting member 1181 crosses the second outline included in the second projection of the opening 1161 of the metal layer 116 at a third intersection P3 and a fourth intersection P4, and a second distance D2 is between the third intersection P3 and the fourth intersection P4. Herein, the second distance D2 is greater than the first distance D1.

In the present embodiment, the width of the connecting member 1181 on the second outline included in the second projection of the opening 1161 of the metal layer 116 (i.e. the second distance D2 between the third intersection P3 and the fourth intersection P4) is greater than the width of the connecting member 1181 on the first outline included in the first projection of the gate electrode 114 (i.e. the first distance D1 between the first intersection P1 and the second intersection P2), which indicates that the connecting member 1811 has a larger width at the opening 1161 of the metal layer 161 in comparison with another part of the connecting member 1181 that locates outside the opening 1161 of the metal layer 161 and simultaneously overlaps the gate electrode 114 and the metal layer 116. When the connecting member 1181 is designed to have a larger width at the opening 1161 of the metal layer 116, the contact area of the connecting member 1181 at the opening 1161 can be increased. Therefore, the peeling of the connecting member 1181 at the opening 1161 due to the height difference can be prevented to ensure the good electrical connection between the connecting member 1181 and the gate electrode 114.

As shown in FIG. 2, FIG. 5 and FIG. 6, the display device further comprises a compensation transistor T3, the connecting member 1181 comprises a first terminal part 1181a and a second terminal part 1181b, the first terminal part 1181a electrically connects to the gate electrode 114 through the contact via 1171, and the second terminal part 1181b electrically connects to a drain electrode 1122' of the compensation transistor T3.

FIG. 3 and FIG. 5 are top views showing the driving transistor T1, the compensation transistor T3 and the compensation capacitor C1 in a part of the equivalent circuit shown in FIG. 2. In the present embodiment, as shown in FIG. 3 to FIG. 5, the metal layer 116 partially overlapped the gate electrode 114 in a direction perpendicular to a surface of the substrate to form a capacitor, which is the compensation capacitor C1 shown in FIG. 2. As shown in FIG. 2, FIG. 5 and FIG. 6, the connecting member 1181 not only can supply a compensation capacitance to the driving transistor T1 but also can electrically connect to the compensation transistor T3 to provide a compensation capacitance to the compensation transistor T3. Hence, when the connecting member 1181 has a larger width at the opening 1161 of the metal layer 116, not only the good electrical connection between the connecting member 1181 and the gate electrode 114 can be ensured to form the compensation capacitor C1 (as shown in FIG. 2), but also the compensation capacitance supplement from the connecting member 1181 to the driving transistor T1 and the capacitance transistor T3 can further be ensured.

As shown in FIG. 5 and FIG. 6, the display device of the present embodiment further comprises a power supply circuit 1182 locating adjacent to the connecting member 1181. A connection between the first intersection P1 and the second intersection P2 is extended along a first direction X. The connecting member 1181 further comprises a middle part 1181c located between the first terminal part 1181a and the second terminal part 1181*b*, and a width W3 of the middle part 1181*c* in the first direction X is less than a width W1 of the first terminal part 1181*a* or a width W2 of the second terminal part 1181*b* in the first direction X. In other words, the middle part 1181*c* of the connecting member 1181 has the smallest width. Since the first terminal part 1181*a* and the second terminal part 1181*b* have to extend into the contact vias 1171, 1172, the first terminal part 1181*a* and the second terminal part 1181*b* is required to have larger widths; therefore, the peeling of the first terminal part 1181*a* and the second terminal part 1181*b* at the contact vias 1171, 1172 due to the height difference can be prevented. However, unlike the region where the first terminal part 1181*a* and the second terminal part 1181*b* disposed thereon, the region where the middle part 1181*c* disposed thereon does not have the height difference; therefore, the middle part 1181*c* is not required to have larger width. Hence, the width of the middle part 1181*c* can be reduced, and the gap between the middle part 1181*c* and the power supply circuit 1182 can be maintained.

Figure 7:
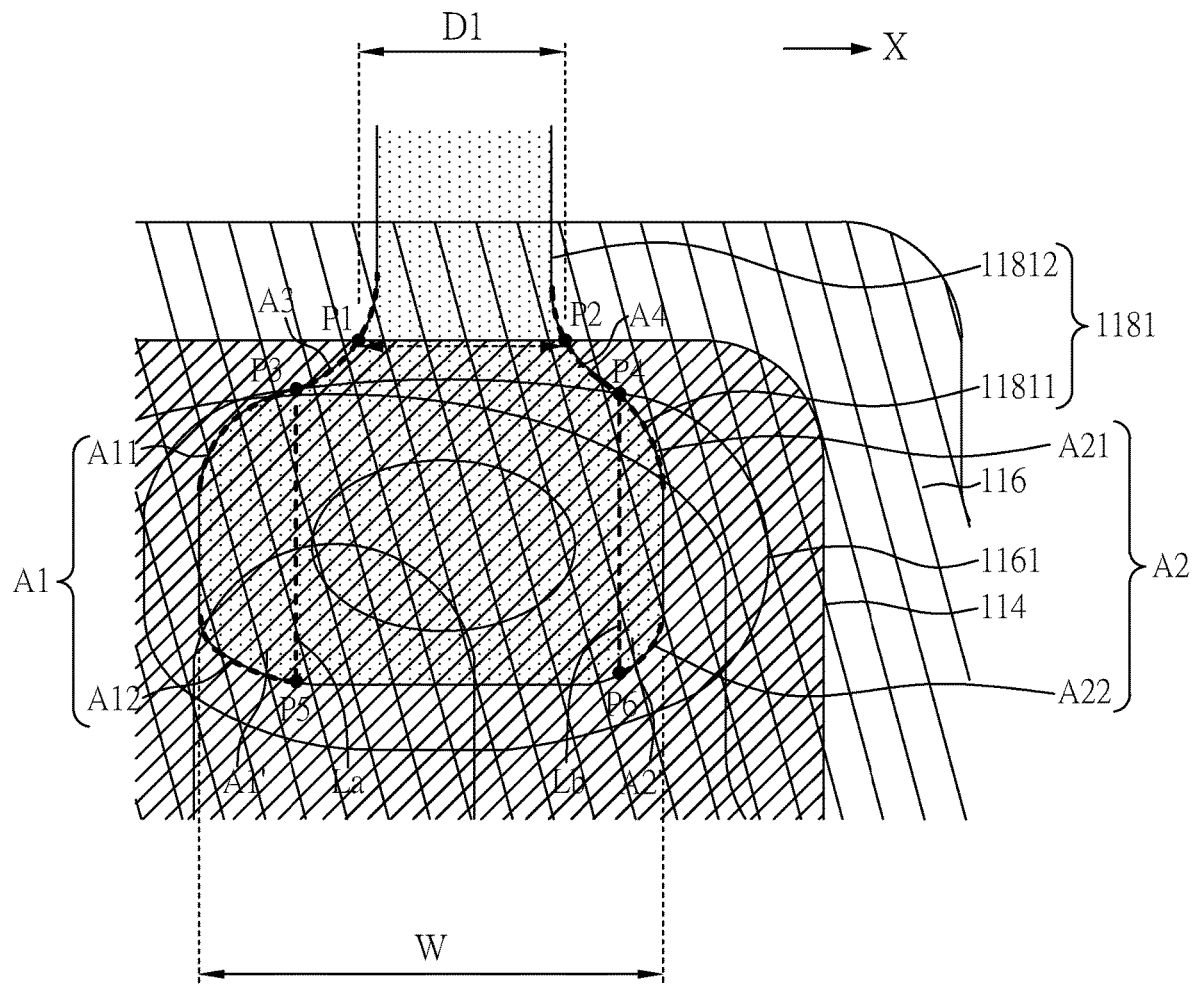

FIG. 7 is an enlarged view of parts of FIG. 5. As shown in FIG. 7, the third outline included in the third projection of the connecting member 1181 comprises a first part 11811 and a second part 11812, the first part 11811 locates inside the second projection of the opening 1161 of the metal layer 116, and the second part 11812 locates outside the second projection of the opening 1161. Herein, a connection between the first intersection P1 and the second intersection P2 is extended along a first direction X, a first virtual line La is perpendicular to the first direction X and crosses the first part 11811 at the third intersection P3 and a fifth intersection P5, and the first part 11811 includes a first curve A1 between the third intersection P3 and the fifth intersection P5. Herein, the first curve A1 comprises a first curve segment A11 and a second curve segment A12 (as indicated by dash lines), the first curve segment A11 is connected to the third intersection P3, the second curve segment A12 is connected to the fifth intersection P5, and a curvature radius of the first curve segment A11 can be identical to or different from a curvature radius of the second curve segment A12. In the present embodiment, the curvature radius of the first curve segment A11 is different from the curvature radius of the second curve segment A12.

In addition, a second virtual line Lb is perpendicular to the first direction X and crosses the first part 11811 at the fourth intersection P4 and a sixth intersection P6, and the first part 11811 includes a second curve A2 between the fourth intersection P4 and the sixth intersection P6. Herein, the second curve A2 comprises a third curve segment A21 and a fourth curve segment A22 (as indicated by dash lines), the third curve segment A21 is connected to the fourth intersection P4, the fourth curve segment A22 is connected to the sixth intersection P6, and a curvature radius of the third curve segment A21 can be identical to or different from a curvature radius of the fourth curve segment A22. In the present embodiment, the curvature radius of the third curve segment A21 is different from the curvature radius of the fourth curve segment A22.

As shown in FIG. 7, the function of the connecting member 1181 it to transfer currents. If the connecting member 1181 does not have the aforesaid first curve A1 and second curve A2 but has sharp corners at these regions, charge residue may be easily occurred at the sharp corners, resulting in electrostatic discharge which may cause the damage of the connecting member 1181. Hence, in the display device of the present embodiment, when the connecting member 1181 is designed to have the aforesaid first curve A1 and second curve A2, no sharp corners are formed at these regions; therefore, the electrostatic discharge caused by the charge residue can be prevented.

Furthermore, the third outline included in the third projection of the connecting member 1181 has a third curve A3 and a fourth curve A4 respectively near to the first intersection P1 and the second intersection P2. More specifically, the third curve A3 is between the first intersection P1 and the third intersection P3, and the fourth curve A4 is between the second intersection P2 and the fourth intersection P4.

As shown in FIG. 7, a first area A1' is enclosed by the first virtual line La and the first curve A1, a second area A2' is enclosed by the second virtual line Lb and the second curve A2, and the first area A1' is different from the second area A2'.

In addition, as shown in FIG. 7, a connection between the first intersection P1 and the second intersection P2 is extended along a first direction X, a part of the connecting member 1181 inside the opening 1161 of the metal layer 116 has a width W along the first direction X, and the width W is greater than the first distance D1.

Figure 8:
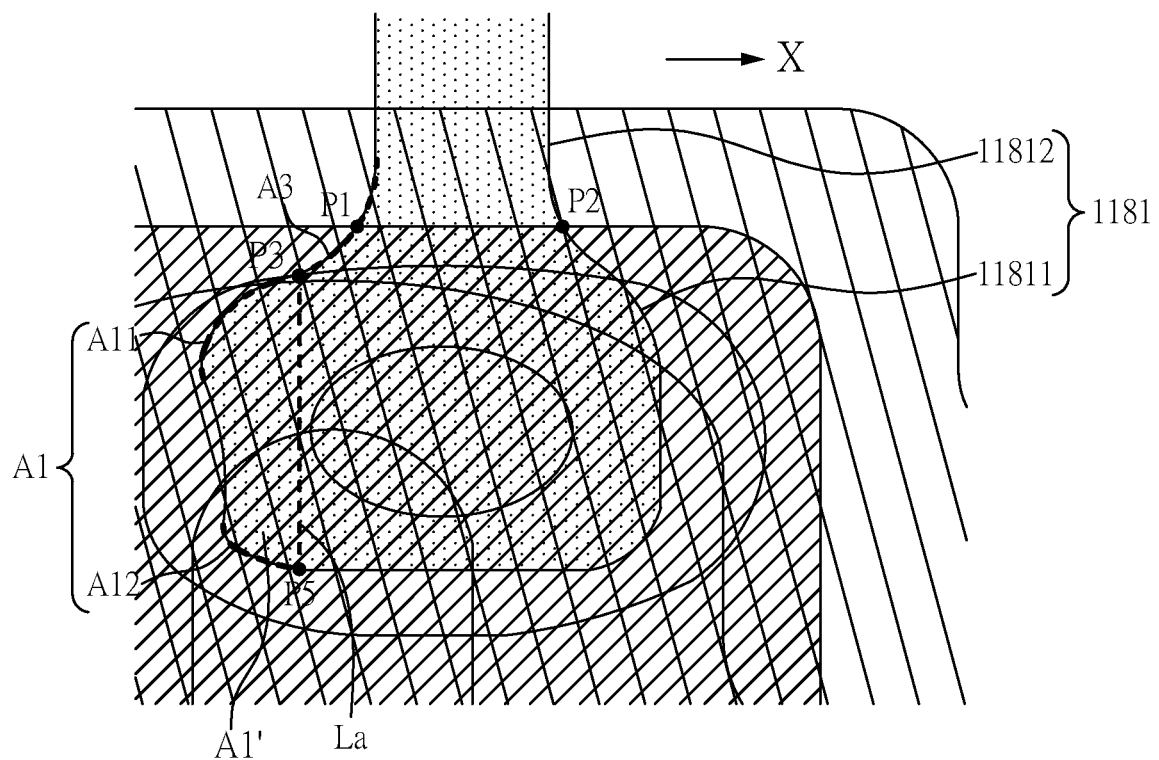
FIG. 8 and FIG. 9 are perspective views showing a connecting member of a display device according to other embodiments of the present disclosure.
Figure 9:
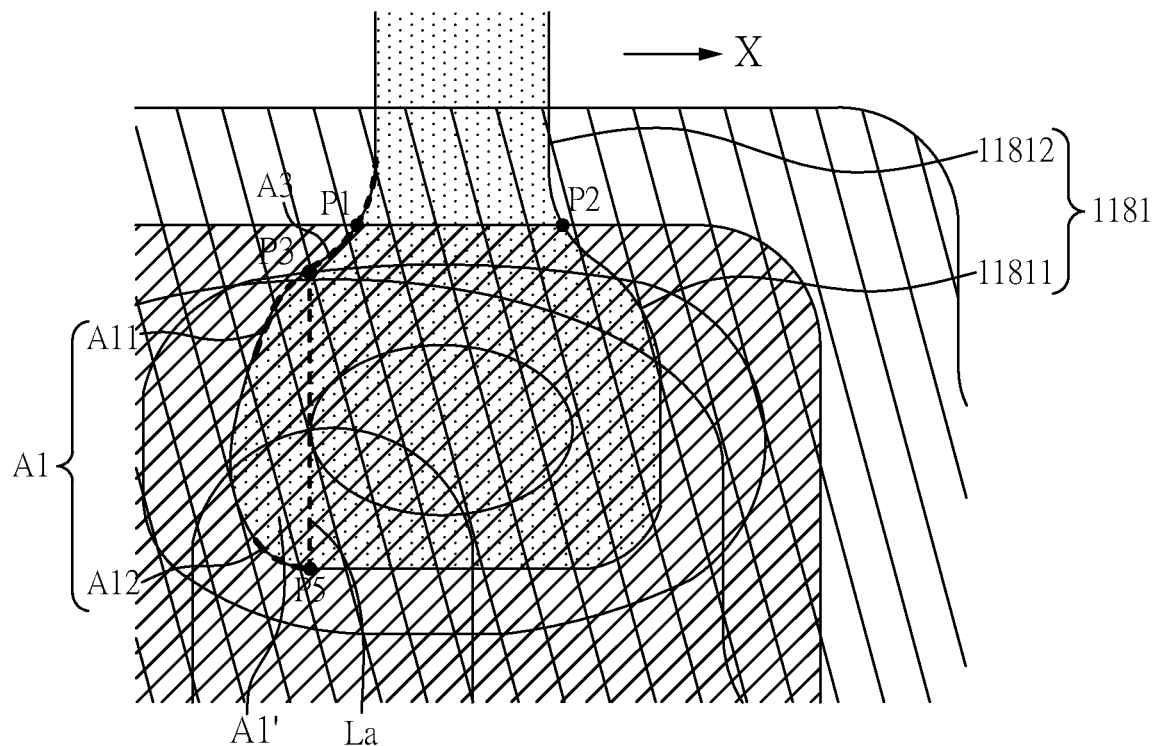

FIG. 8 and FIG. 9 are perspective views showing a connecting member of a display device according to other embodiments of the present disclosure. The structures of the display devices shown in FIG. 8 and FIG. 9 are similar to those described in the aforementioned embodiments, except that the first curve A1 of the first part 11811 between the third intersection P3 and the fifth intersection P5 has different shapes and the curvature radiuses of the first curve segment A11 and the second curve segment A12 are different from those described in the aforementioned embodiments. For example, the curvature radius of the first curve segment A11 shown in FIG. 9 is different from the curvature radius of the first curve segment A11 shown in FIG. 7 or FIG. 8. In addition, the first area A1' enclosed by the first virtual line La and the first curve A1 shown in FIG. 8 or FIG. 9 is smaller than the first area A1' enclosed by the first virtual line La and the first curve A1 shown in FIG. 7. In addition, the shapes of the segment between the first curve segment A11 and the second curve segment A12 is approximately linear. In FIG. 8, the shapes of the segment between the first curve segment A11 and the second curve segment A12 is concave, so the segment between the first curve segment A11 and the second curve segment A12 has reverse points at the points that the segment connecting to the first curve segment A11 and the second curve segment A12. In FIG. 9, the shapes of the segment between the first curve segment A11 and the second curve segment A12 is approximately convex. However, the shape of the connecting member of the present disclosure is not limited to those shown in FIG. 7 to FIG. 9, and the connecting member can have other shape.

A display device made as described in any of the embodiments of the present disclosure as described previously may be integrated with a touch panel to form a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
   a substrate;
   a gate electrode disposed on the substrate, wherein a first projection is defined by projecting the gate electrode on the substrate;
   at least one data line disposed on the substrate and extending along an extension direction; and
   a connecting member disposed on the gate electrode and electrically connecting to the gate electrode, wherein the connecting member comprises a first terminal part and a middle part, the middle part is connected to the first terminal part, and a maximum width of the middle part in a direction perpendicular to the extension direction is less than a maximum width of the first terminal part in the direction,
   wherein a second projection is defined by projecting the connecting member on the substrate, an overlapping region is defined as a region of the second projection overlapping the first projection, and an area of the first projection is greater than an area of the overlapping region.

2. The display device of claim 1, further comprising an insulating layer disposed between the first terminal part and the gate electrode, wherein a contact via penetrates the insulating layer, and the first terminal part electrically connects to the gate electrode through the contact via.

3. The display device of claim 2, wherein the connecting member further comprises a second terminal part, the middle part is located between the first terminal part and the second terminal part, the second terminal part is relatively away from the contact via in the extension direction, and the maximum width of the middle part in the direction is less than a maximum width of the second terminal part in the direction.

4. The display device of claim 1, further comprising a metal layer disposed between the gate electrode and the connecting member, wherein the metal layer includes an opening, and the maximum width of the first terminal part in the direction is less than a maximum width of the opening in the direction.

5. The display device of claim 4, wherein a third projection is defined by projecting the metal layer on the substrate, and an area of the third projection is greater than the area of the first projection.

6. The display device of claim 5, wherein in a top view of the display device, the third projection partially overlaps the first projection.

7. The display device of claim 1, wherein the first projection comprises a first outline, the second projection comprises a second outline, the first outline crosses the second outline at a first intersection and a second intersection, and a distance between the first intersection and the second intersection is greater than the maximum width of the middle part in the direction.

8. The display device of claim 1, further comprising a power supply circuit disposed on the substrate, wherein the connecting member is located adjacent to the power supply circuit.

9. The display device of claim 8, wherein in a top view of the display device, the first projection partially overlaps the power supply circuit.

10. The display device of claim 1, wherein the connecting member includes a curved edge.

11. A display device, comprising:
    a substrate;
    a gate electrode disposed on the substrate;
    at least one data line disposed on the substrate and extending along an extension direction; and
    a connecting member disposed on the gate electrode and electrically connecting to the gate electrode, wherein the connecting member comprises a first terminal part and a middle part, the middle part is connected to the first terminal part, and a maximum width of the middle part in a direction perpendicular to the extension direction is less than a maximum width of the terminal part in the direction,
    wherein in a top view of the display device, the connecting member partially overlaps the gate electrode.

12. The display device of claim 11, further comprising an insulating layer disposed between the first terminal part and the gate electrode, wherein a contact via penetrates the insulating layer, and the first terminal part electrically connects to the gate electrode through the contact via.

13. The display device of claim 12, wherein the connecting member further comprises a second terminal part, the middle part is located between the first terminal part and the second terminal part, the second terminal part is relatively away from the contact via in the extension direction, and the maximum width of the middle part in the direction is less than a maximum width of the second terminal part in the direction.

14. The display device of claim 11, further comprising a metal layer disposed between the gate electrode and the connecting member, wherein the metal layer includes an opening, and the maximum width of the first terminal part in the direction is less than a maximum width of the opening in the direction.

15. The display device of claim 14, wherein a first projection is defined by projecting the gate electrode on the substrate, a third projection is defined by projecting the metal layer on the substrate, and an area of the third projection is greater than an area of the first projection.

16. The display device of claim 15, wherein in the top view of the display device, the third projection partially overlaps the first projection.

17. The display device of claim 15, wherein the first projection comprises a first outline, the second projection comprises a second outline, the first outline crosses the second outline at a first intersection and a second intersection, and a distance between the first intersection and the second intersection is greater than the maximum width of the middle part in the direction.

18. The display device of claim 15, further comprising a power supply circuit disposed on the substrate, wherein in a top view of the display device, the first projection partially overlaps the power supply circuit.

19. The display device of claim 11, further comprising a power supply circuit disposed on the substrate, wherein the connecting member is located adjacent to a power supply circuit.

20. The display device of claim 11, wherein the connecting member includes a curved edge.

* * * * *